United States Patent
Kim

(10) Patent No.: US 7,785,914 B2
(45) Date of Patent: Aug. 31, 2010

(54) IMAGE SENSOR AND METHOD FOR MANUFACTURING THE SAME

(75) Inventor: Yung-Pil Kim, Gyeongi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 246 days.

(21) Appl. No.: 11/831,551

(22) Filed: Jul. 31, 2007

(65) Prior Publication Data

US 2008/0029797 A1     Feb. 7, 2008

(30) Foreign Application Priority Data

Aug. 1, 2006     (KR) .................. 10-2006-0072459

(51) Int. Cl.
 *H01L 21/00*     (2006.01)
 *H01L 31/062*    (2006.01)
 *H01L 31/113*    (2006.01)

(52) U.S. Cl. .................... 438/60; 438/70; 257/292; 257/E27.133; 257/E31.127

(58) Field of Classification Search ............. 438/57–81, 438/48
See application file for complete search history.

(56) References Cited

U.S. PATENT DOCUMENTS 6,617,189 B1    9/2003   Chen et al.
2003/0176010 A1* 9/2003  Kim .................. 438/70
2006/0124948 A1* 6/2006  Lee .................. 257/98
2006/0170069 A1* 8/2006  Kim .................. 257/432
2008/0213938 A1* 9/2008  Kao .................. 438/69

FOREIGN PATENT DOCUMENTS

JP    2000150846 A  *  5/2000
JP    2004-071931        3/2004

* cited by examiner

*Primary Examiner*—Savitri Mulpuri
*Assistant Examiner*—Calvin Choi
(74) *Attorney, Agent, or Firm*—Sherr & Vaughn, PLLC

(57) ABSTRACT

An image sensor including a substrate and an interlayer dielectric layer divided into a pixel region and a logic pad region. An image sensor may include at least one of the following: a color filter, an over coating layer, and a micro lens sequentially formed over the interlayer dielectric layer in the pixel region; a top conductive layer formed over the interlayer dielectric layer of the logic pad region; an etch stop layer formed over the interlayer dielectric layer in the logic pad region and on the sides and a portion of an upper surface of a top conductive layer; and a first and second protective layers sequentially formed over the etch stop layer.

20 Claims, 3 Drawing Sheets

IMAGE SENSOR AND METHOD FOR MANUFACTURING THE SAME

Figure 1:
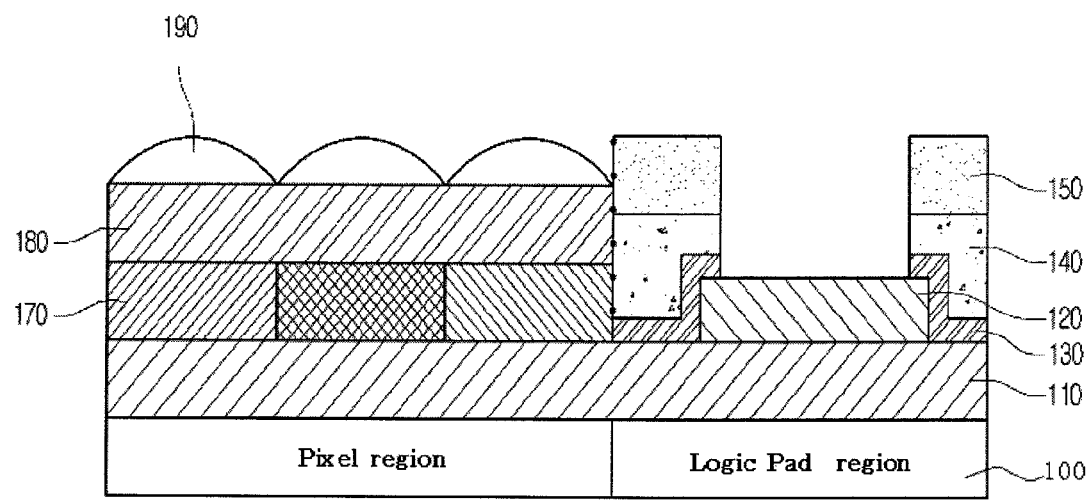
Figure 2:
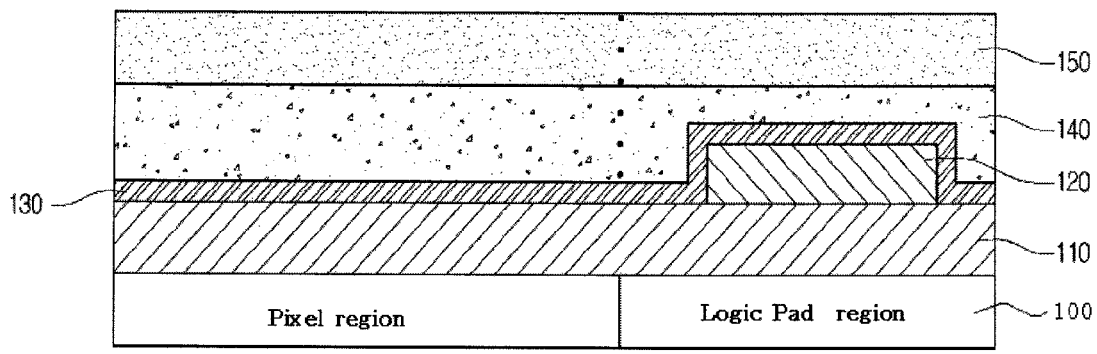

The present application claims priority under 35 U.S.C. 119 to Korean Patent Application No. 10-2006-0072459 (filed on Aug. 1, 2006), which is hereby incorporated by reference in its entirety.

BACKGROUND

Image sensors may be semiconductor devices that convert an optical image into electrical signals. Two types of image sensors are charge coupled device (CCD) image sensors and complementary metal oxide silicon (CMOS) image sensors. A unit pixel of a CMOS image sensor may include a photodiode (e.g. to detect light) and a MOS transistor (e.g. to detect electrical signals at each unit pixel), which may result in an electrical image representation.

However, there may be complications in image sensors when the thickness of a protective layer on and/over a top conductive layer is too large, resulting in a light condenser (e.g. a light condenser including a color filter and a micro lens) being too far away from a photodiode, which may result in deteriorated image characteristics.

SUMMARY

Embodiments relate to a method which substantially simultaneously etches protective layers in a pixel array (e.g. in a protective layer etching process) to form a bonding pad area. Etching protective layers may reduce the distance between a light condenser and a sensor, which may improve image characteristics of an image sensor, in accordance with embodiments.

In embodiments, an image sensor may include a substrate with an interlayer dielectric layer formed on and/or over the substrate. An image sensor may be divided into a pixel region and a logic pad region, in accordance with embodiments. In embodiments, an image sensor may include at least one of a color filter, an over coating layer, and a micro lens, a top conductive layer, an etch stop layer; and a first and second protective layers. In embodiments, a micro lens may be sequentially formed on and/or over the interlayer dielectric layer in the pixel region. In embodiments, the top conductive layer may be formed on and/or over the interlayer dielectric layer in the logic pad part. In embodiments, the etch stop layer may be formed on and/or over the interlayer dielectric layer in the logic pad part and on and/or over the side and a portion of an upper surface of the top conductive layer. In embodiments, first and second protective layers may be sequentially formed on and/over the etch stop layer Embodiments relate to a method of manufacturing an image sensor including a substrate and an interlayer dielectric layer divided into a pixel region and logic pad region. In embodiments, the method includes at least one of the following steps: Forming a top conductive layer on and/or over an interlayer dielectric layer in the logic pad region. Forming an etch stop layer on and/or over the substrate and the top conductive layer. Sequentially forming a first protective layer and a second protective layer on and/or over the etch stop layer. Exposing the etch stop layer in the pixel region and the etch stop layer on the top conductive layer by etching the first protective layer and the second protective layer in the pixel region and a portion of the first protective layer and the second protective layer over the top conductive region in the logic pad region. Exposing the interlayer dielectric layer in the pixel region and the top conductive layer by selectively etching the etch stop layer in the pixel region and the etch stop layer in the top conductive layer region. Sequentially forming a color filter, an over coating layer, a micro lens on and/or over the interlayer dielectric layer exposed in the pixel region.

Embodiments relate to a method of manufacturing an image sensor including a substrate and an interlayer dielectric layer divided into a pixel region and logic pad region. In embodiments, the method includes at least one of the following steps: Forming a top conductive layer on and/or over a interlayer dielectric layer in the logic pad region. Forming an etch stop layer on and/or over the substrate and the top conductive layer. Sequentially forming a first protective layer and a second protective layer on and/or over the etch stop layer. Exposing the etch stop layer in the pixel region and the etch stop layer on and/or over the top conductive layer by etching the first protective layer and the second protective layer in the pixel region and a portion of the first protective layer and the second protective layer on and/or over the top conductive region in the logic pad region. Exposing the interlayer dielectric layer in the pixel region by etching the etch stop layer in the pixel region. Sequentially forming a color filter, an over coating layer, a micro lens on and/or over the interlayer dielectric layer exposed in the pixel region. Exposing the top conductive layer by etching the etch stop layer exposed in the logic pad region.

DRAWINGS

Example FIG. 1 illustrates a cross-sectional view of an image sensor, according to embodiments.

Example FIGS. 2 to 5 are process cross-sectional views illustrating a method of manufacturing an image sensor, according to embodiments.

DESCRIPTION

Example FIG. 1 illustrates an image sensor, according to embodiments. In embodiments, an image sensor may be divided into a predetermined pixel region and logic pad region. An image sensor may include substrate 100 with an interlayer dielectric layer 110 that may be formed on and/or substrate 100. Various metal wirings may be formed in, on, and/or over substrate 100. In the pixel region, color filters 170 (e.g. blue, green, red, yellow, magenta, and/or cyan color filters) may be formed on and/or over interlayer dielectric layer 110. In the pixel region, over coating layer (OCL) 180 may be formed on and/or over color filters 170 which may serve as a planarization layer, in accordance with embodiments. In the pixel region, micro lens 190 may be formed on and/or over OCL 180. In embodiments, micro lens 190 may be formed by forming a lens pattern as a photoresist layer on and/or over OCL 180. In embodiments, different micro lens 190 may not overlap.

In the logic pad region, top conductive layer 120 may be formed on and/or over interlayer dielectric layer 110, in accordance with embodiments. In the logic pad region, etch stop layer 130 may be formed on and/or over interlayer dielectric layer 110, on and/or over the sides of top conductive layer 120, and on and/or over a portion of the upper surface of top conductive layer 120. In embodiments, etch stop layer 130 may be formed of Si3N4 and/or SiON. In embodiments, etch stop layer 130 may include a material such that the etching selectivity of a first protective layer 140 and a second protective layer 150 against etch stop layer 130 may be approximately 5 to 15:1. One of ordinary skill in the art would appreciate other materials within the spirit and scope of embodiments. In embodiments, the etching selectivity of first protective layer 140 and second protective layer 150 against etch stop layer 130 may be 10:1, so that etch stop layer 130 can be minimally etched when the first protective layer 140 and the second protective layer 150 are etched.

In embodiment, a light condenser and/or a color filter may be positioned relatively low and/or close to a semiconductor substrate so that the distance from the light condenser to a sensor is minimized, which may optimize image characteristics of an image sensor. A light condenser and/or a color filter may be relatively low and/or close by minimizing the thickness of a first protective layer and a second protective layer, in accordance with embodiments.

In embodiments, a wide pixel array may be uniformly etched to minimize thickness differences using the different etching selectivity between protective layers and the etch stop layer. In accordance with embodiments, an image sensor may have relatively stable image characteristics without large changes within the image sensor chips and between image sensor chips.

Example FIGS. 2 through 5 illustrate a method of forming an image sensor, in accordance with embodiments. As illustrated in example FIG. 2, substrate 100 (e.g. a semiconductor substrate) may have a predetermined pixel region and logic pad, in accordance with embodiments. Interlayer dielectric layer 110 may be formed on and/or over substrate 100. Top conductive layer 120 may be formed on and/or over interlayer dielectric layer 110 in a logic pad region. In embodiments, top conductive layer 120 may function as a bonding pad.

In embodiments, an etch stop layer 130 may be formed on and/or over substrate 100, interlayer dielectric layer 110, and/or top conductive layer 120. Etch stop layer 130 may be formed using Si3N4 or SiON, in accordance with embodiments. Etch stop layer 130 may be formed so that the etching selectivity of first protective layer 140 and second protective layer 150 against the etch stop layer 130 is approximately 5 to 15:1, in accordance with embodiments. In embodiments, the etching selectivity of first protective layer 140 and second protective layer 150 against etch stop layer 130 is approximately 10:1, so that etch stop layer 130 may be minimally etched during etching of first protective layer 140 and second protective layer 150. In embodiments, first protective layer 140 and second protective layer 150 are sequentially formed on and/or over etch stop layer 130. In embodiments, first protective layer 140 and/or second protective layer 150 may be planarized.

Figure 3:
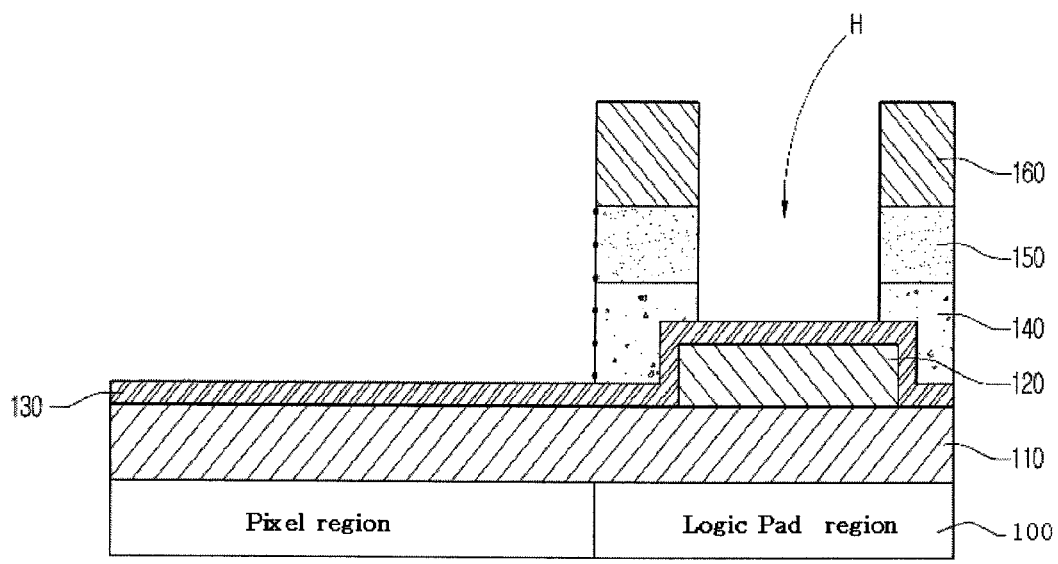

As illustrated in example FIG. 3, in the pixel region substantially the entire first protective layer 140 and second protective layer 150 may be etched, in accordance with embodiments. In the logic pad region, only a portion of first protective layer 140 and second protective layer 150 on and/or over top conductive layer 120 may be selectively etched, in accordance with embodiments. In embodiments, selective etching of first protective layer 140 and second protective layer 150 may use photoresist pattern 160 as an etch mask. In embodiments, first protective layer 140 and second protective layer 150 on both a pixel region and a logic pad region may be etched simultaneously. During etching, photoresist pattern 160 may be used as an etch mask in the logic pad region to form hole H over conductive layer 120 in first protective layer 140 and second protective layer 150. First protective layer 140 and second protective layer 150 may be etched so that etch stop layer 130 is exposed. In embodiments, in order to expose etch stop layer 130 in a pixel region and expose etch stop layer 130 over the top conductive layer 120 in a logic pad region, the same mask may be used.

Figure 4:
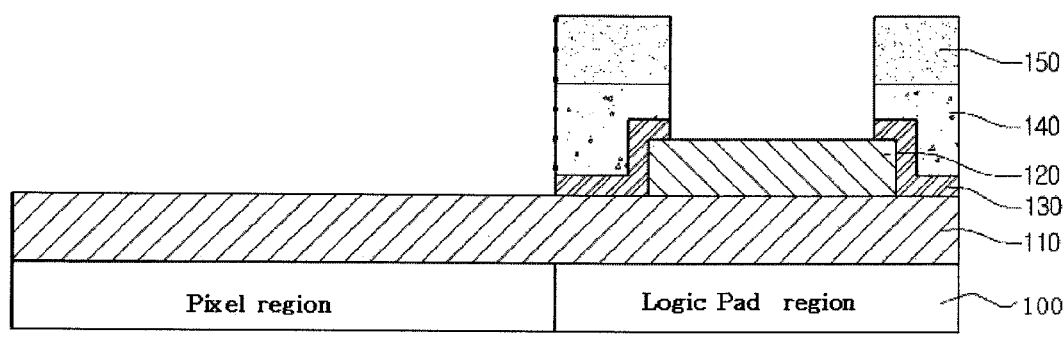

As illustrated in example FIG. 4, exposed etch stop layer 130 on and/or over a pixel region and a selected portion of etch stop layer 130 on/over logic pad region may be etched, in accordance with embodiments. In embodiments, exposed etch stop layer 130 may be selectively etched using photoresist layer 160 as an etch mask. In other words, photoresist layer 160 is not removed prior to etch stop layer 130 being selectively etched. In embodiments, selective etching of etch stop layer 130 in a logic pad region exposes a portion of top conductive layer 120. In embodiments, selective etching of etch stop layer 130 in a pixel region, exposes interlayer dielectric layer in a pixel region. In embodiments, after etch stop layer 130 is etched, photoresist layer 160 is removed.

In embodiments, photoresist layer 160 is removed prior to etch stop layer 130 being selectively removed in a pixel region and a logic pad region. Accordingly, remaining portions of first protective layer 140 and second protective layer 150 may be used as an etch mask for etching etch stop layer 130 to expose interlayer dielectric layer 110 in a pixel region and a portion of top conductive layer 120 in a logic pad region, in accordance with embodiments.

Figure 5:
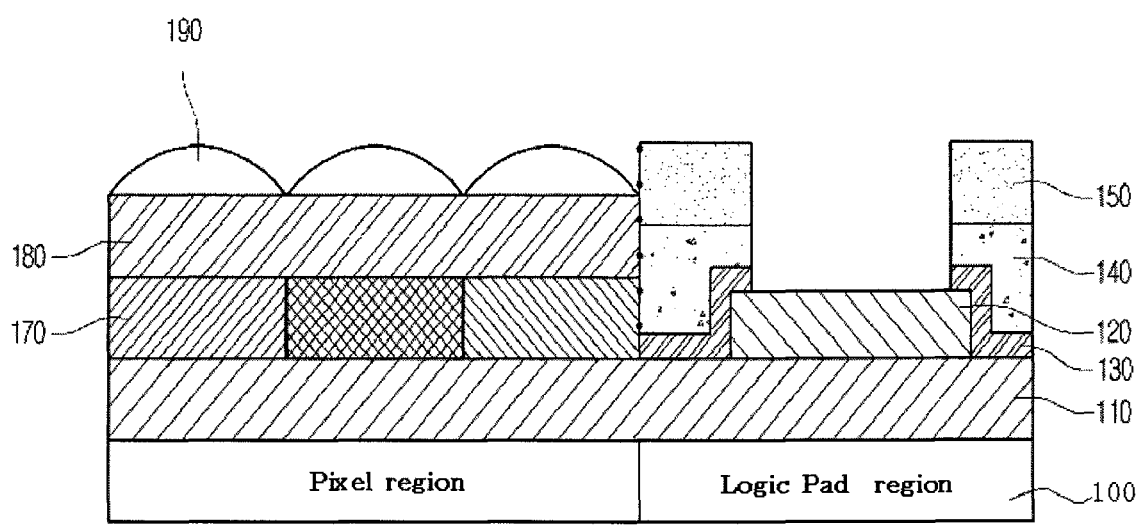

As illustrated in example FIG. 5, color filter 170, over coating layer 180, and/or micro lens 190 may be sequentially formed on and/or over interlayer dielectric layer 110 in a pixel region, in accordance with embodiments. In embodiments, color filter 170 may include at least one of a blue color filter pattern, a green color filter pattern, a red color filter pattern, a yellow color filter pattern, a magenta color filter pattern, and a cyan color filter pattern. However, one of ordinary skill in the art would appreciate other colors and combinations of colors of color filters. Over coating layer (OCL) 180 may be formed on and/or over color filter 170, in accordance with embodiments. In embodiments, OCL 180 may serve as a planarization layer. In embodiments, micro lens 190 may be formed by forming a lens pattern as a photoresist layer on and/or over OCL 180, in accordance with embodiments. In embodiments, a lens pattern does not overlap between two different micro lenses of micro lens 190.

In embodiments, micro lens 190 may be formed to have a dome shape. Micro lens 190 may be formed to have a dome shape by forming a lens pattern on OCL 180 as a photoresist layer, performing a bleaching process on the micro lens pattern, and/or performing a first flow process, in accordance with embodiments. In embodiments, a gap may be formed between different micro lenses of micro lens 190. In embodiments, a gap between different micro lenses of micro lens 190 may be between approximately 0.5 µm and 1.0 µm. When a gap is below 0.5 µm, a bleaching phenomenon may occur, such that micro lenses stick to each other in a flow process, in accordance with embodiments.

Embodiments relate to a method of manufacturing an image sensor by exposing top conductive layer 120 by removing etch stop layer 130. In embodiments, characteristics of a manufacturing process may prevent contamination of top conductive layer 120 by delaying exposure of top conductive layer 120 as late as possible.

In embodiments, a method of manufacturing an image sensor includes at least one of the following steps: Forming a top conductive layer 120. Forming an etch stop layer 130. Sequentially forming a first protective layer 140 and a second protective layer 150. Exposing the etch stop layer 130 in a pixel region and partially exposing the etch stop layer 130 on and/over the top conductive layer in a logic pad region.

In embodiments, in order to etch the etch stop layer 130 in the pixel region prior to etching the etch stop layer 130 in the logic pad region, a photoresist layer is formed over top conductive layer 120 in a logic pad region prior to etching etch stop layer 130 in a pixel region. In other words, a photoresist is formed on and/or over both top conductive layer 120 and a portion of etch stop layer 130 in a pad logic region, in accordance with embodiments. Accordingly, a portion of the etch stop layer 130 in a pixel region is selectively etched to expose interlayer dielectric layer 110 in the pixel region, while etch stop layer 130 over top conductive layer 120 is not etched. Other variations will be apparent to those skilled in the art to prevent allow etch stop layer 130 in a pixel region to be etched prior to etch stop layer 130 in a logic pad region to be etched.

In embodiments, color filter 170, over coating layer 180, and/or a micro lens 190 may be sequentially formed on and/or over interlayer dielectric layer 110 in a pixel region. Formation of color filter 170, over coating layer 180, and/micro lens 190 may be similar to the embodiments discussed above. After color filter 170, over coating layer 180, and/or a micro lens 190 are sequentially formed, a portion of etch stop layer 130 on and/or over top conductive layer 120 may be etched to expose top conductive layer 120, in accordance with embodiments.

In accordance with embodiments, delaying exposure of top conductive layer 120 until after color filter 170, over coating layer 180, and/or micro lens 190 may minimize or substantially prevent contamination of top conductive layer 120 during formation of color filter 170, over coating layer 180, and/or micro lens 190. Further, a light condenser and/or a color filter may be positioned relatively low by minimizing the thickness of protective layers, so that the distance between a light condenser and a sensor is minimized, in accordance with embodiments. By minimizing the distance between a light condenser and a sensor, image characteristics of an image sensor may be optimized.

In embodiments, a wide pixel array can be uniformly etched to minimize thickness difference by using different etching selectivity between a protective layer and an etch stop layer, which may result in an image sensor with relatively stable image characteristics without large changes within the image sensor chips and between the different chips. In embodiments, a staking process of an etch stop layer is implemented and an opening process of a bonding pad region is implemented, which may not negatively effect manufacturing yield while improving device performance quality.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming an interlayer dielectric layer over a substrate, wherein the substrate has a pixel region and a logic pad region;
    forming a top conductive layer over the interlayer dielectric layer in the logic pad region;
    forming an etch stop layer over the interlayer dielectric layer and the top conductive layer;
    forming at least one protective layer over the etch stop layer;
    selectively etching said at least one protective layer using a photoresist mask, wherein substantially all of said at least one protective layer is removed in the pixel region and a portion of said at least one protective layer is selectively removed in the logic pad region, wherein said at least one protective layer is selectively removed over at least a portion of the top conductive layer in the logic pad region; and
    removing substantially all of the etch stop layer in the pixel region;
    selectively removing a portion of the etch stop layer in the logic pad region,
    wherein the etch stop layer is selectively removed over at least a portion of the top conductive layer in the logic pad region;
    forming at least one color filter above the uppermost surface of a portion of the interlayer dielectric layer formed in the pixel region;
    forming an over coating layer over said at least one color filter in the pixel region; and
    forming at least one micro lens over the over coating layer in the pixel region,
    wherein the interlayer dielectric layer is in direct contact with both said at least one color filter and the top conductive layer.

2. The method of claim 1, wherein said removing substantially all of the etch stop layer in the pixel region and said selectively removing a portion of the etch stop layer in the logic pad region are performed at the same time.

3. The method of claim 1, wherein said removing substantially all of the etch stop layer in the pixel region is performed prior to said selectively removing a portion of the etch stop layer in the logic pad region.

4. The method of claim 3, wherein:
    said forming at least one color filter over the interlayer dielectric layer in the pixel region is performed prior to said selectively removing a portion of the etch stop layer in the logic pad region;
    said forming an over coating layer over said at least one color filter in the pixel region is performed prior to said selectively removing a portion of the etch stop layer in the logic pad region; and
    said forming at least one micro lens over the over coating layer in the pixel region is performed prior to said selectively removing a portion of the etch stop layer in the logic pad region.

5. The method of claim 3, wherein the etch stop layer covers an entire side surface of the top conductive layer.

6. The method of claim 1, wherein said forming at least one protective layer comprises planarizing said at least one protective layer.

7. The method of claim 1, wherein said forming at least one protective layer comprises:
    forming a first protective layer; and
    forming a second protective layer.

8. The method of claim 1, wherein said selectively etching said at least one protective layer uses an etching selectivity of said at least one protective layer against the etch stop layer of approximately 5 to 15:1.

9. The method of claim 1, wherein the etch stop layer comprises at least one of $Si_3N_4$ and SiON.

10. The method of claim 1, wherein the method is comprised in a method of forming an image sensor.

11. The method of claim 1, wherein the etch stop layer covers an entire side surface of the top conductive layer.

12. The method of claim 1, wherein a part of said at least one protective layer is in direct contact with said at least one color filter and the over coating layer.

13. The method of claim 1, wherein a part of the etch stop layer is in direct contact with one of said at least one color filter.

14. The method of claim 1, wherein the interlayer dielectric layer is in direct contact with the substrate.

15. A method comprising:
    forming an interlayer dielectric layer in both a pixel region and a logic pad region of a substrate;
    forming a top conductive layer on a part of the interlayer dielectric layer formed in the logic pad region;

forming an etch stop layer on a part of the interlayer dielectric layer formed in the logic pad region and a top and sides of the top conductive layer;

forming at least one protective layer over the etch stop layer;

forming a hole through said at least one protective layer and the etch stop layer, wherein the hole exposes a part of the top of the top conductive layer;

forming at least one color filter above the uppermost surface of the part of the interlayer dielectric layer formed in the pixel region;

forming an over coating layer over said at least one color filter in the pixel region; and forming at least one micro lens over the over coating layer in the pixel region, wherein the interlayer dielectric layer is in direct contact with both said at least one color filter and the top conductive layer.

16. The method of claim 15, wherein the etch stop layer covers an entire side surface of the top conductive layer.

17. The method of claim 15, wherein a part of said at least one protective layer is in direct contact with said at least one color filter and the over coating layer.

18. The method of claim 15, wherein a part of the etch stop layer is in direct contact with one of said at least one color filter.

19. The method of claim 15, wherein the interlayer dielectric layer is in direct contact with the substrate.

20. The method of claim 15, wherein said forming a hole comprises etching a part of the etch stop layer in the logic pad region after said at least one color filter, the over coating layer, and said at least one micro lens are formed.

* * * * *